United States Patent
You et al.

(10) Patent No.: US 8,704,236 B2
(45) Date of Patent: Apr. 22, 2014

(54) THIN FILM TRANSISTOR AND FLAT PANEL DISPLAY DEVICE INCLUDING THE SAME

(75) Inventors: Chun-Gi You, Yongin (KR); Joon-Hoo Choi, Yongin (KR)

(73) Assignee: Samsung Display Co., Ltd. (KR)

( * ) Notice: Subject to any disclaimer, the term of this patent is extended or adjusted under 35 U.S.C. 154(b) by 117 days.

(21) Appl. No.: 13/223,083

(22) Filed: Aug. 31, 2011

(65) Prior Publication Data

US 2012/0080684 A1 Apr. 5, 2012

(30) Foreign Application Priority Data

Oct. 1, 2010 (KR) .................... 10-2010-0095957

(51) Int. Cl.
*H01L 27/14* (2006.01)
*H01L 29/04* (2006.01)
*H01L 29/15* (2006.01)
*H01L 31/036* (2006.01)

(52) U.S. Cl.
USPC .. 257/72; 438/99; 257/E33.053; 257/E29.294

(58) Field of Classification Search
USPC ............... 257/59, 72, 79, 257, 258, 288, 290, 257/E21.135, E21.154, E21.414, E21.415, 257/635; 438/181, 482, 486, 585, 763, 149, 438/197; 349/106, 114
See application file for complete search history.

(56) References Cited

U.S. PATENT DOCUMENTS

| | | | |
|---|---|---|---|
| 5,237,187 A * | 8/1993 | Suwanai et al. | 257/296 |
| 7,221,039 B2 * | 5/2007 | Huang et al. | 257/646 |
| 2004/0209407 A1 * | 10/2004 | Chae | 438/149 |
| 2006/0008932 A1 * | 1/2006 | Oh et al. | 438/34 |

FOREIGN PATENT DOCUMENTS

| | | |
|---|---|---|
| JP | 7020490 | 1/1995 |
| KR | 100179135 | 11/1998 |
| KR | 1020010054739 | 7/2001 |
| KR | 1020010097932 | 11/2001 |

* cited by examiner

*Primary Examiner* — Sonya D McCall Shepard
(74) *Attorney, Agent, or Firm* — Knobbe Martens Olson & Bear LLP

(57) ABSTRACT

A thin film transistor (TFT) and a flat panel display device including the same. The TFT includes a substrate, a gate electrode formed over the substrate, the gate electrode formed with silicon doped with impurities, a gate wiring connected to the gate electrode, an active layer formed over the gate electrode, and source and drain electrodes connected to the active layer. According to such a structure, since heat flow to the gate electrode during crystallization of the active layer may be prevented, stable crystallization of the active layer may be performed, and thus an error rate of a product may be decreased.

14 Claims, 3 Drawing Sheets

THIN FILM TRANSISTOR AND FLAT PANEL DISPLAY DEVICE INCLUDING THE SAME

CROSS-REFERENCE TO RELATED APPLICATIONS

This application claims the benefit of Korean Patent Application No. 10-2010-0095957, filed on Oct. 1, 2010, in the Korean Intellectual Property Office, the disclosure of which is incorporated herein in its entirety by reference.

BACKGROUND

1. Field

The present disclosure relates to a thin film transistor, and a flat panel display device, such as an organic light-emitting display device or a liquid crystal display device including the thin film transistor.

2. Description of the Related Technology

In general, flat panel display devices, such as organic light-emitting display devices or liquid crystal display devices, include thin film transistors (TFTs) and pixel units that are driven by the TFTs and display an image.

A TFT generally has a structure in which a gate electrode, an active layer, and source and drain electrodes are stacked on a substrate. Accordingly, when a current is applied to the gate electrode through a circuit installed in the substrate, the current is applied to the source and drain electrodes via the active layer, and the current is applied to a pixel electrode of a pixel unit connected to the source or drain electrode at the same time.

The pixel unit generally includes the pixel electrode, an opposite electrode facing the pixel electrode, and an emission operating layer interposed between the pixel electrode and the opposite electrode. If the device is an organic light-emitting display device, the emission operating layer may be an organic emission layer for self-emitting light. If the device is a liquid crystal display device, the emission operating layer may be a liquid crystal layer that selectively allows backlight to pass therethrough.

In such devices, when a current is applied to the pixel electrode through the TFT as described above, an optimal voltage is formed between the pixel electrode and the opposite electrode. Thus, emission occurs in the emission operating layer, thereby displaying an image.

SUMMARY OF CERTAIN INVENTIVE ASPECTS

The present disclosure provides a thin film transistor (TFT) that is improved so as to prevent heat flow to a gate electrode during crystallization of an active layer, and a flat panel display device including the TFT.

According to one aspect, there is provided a TFT which includes a substrate, a gate electrode formed over the substrate, the gate electrode formed with silicon doped with impurities, a gate wiring connected to the gate electrode, an active layer formed over the gate electrode, and source and drain electrodes connected to the active layer.

The gate wiring may include a silicon layer doped with the same impurities as the silicon forming the gate electrode and on the same layer as the gate electrode, and a metal layer formed over the silicon layer.

The active layer may be formed of amorphous silicon crystallized by heating. The impurities may be N-type impurities.

The TFT may further include an etching stop layer on the active layer configured to protect the active layer from being etched. A gate insulating layer may be formed between the gate electrode and the active layer. A passivation layer may be formed over the source and drain electrodes.

According to another aspect, there is provided a flat panel display device including a TFT and a pixel unit driven by the TFT, where the TFT includes a substrate, a gate electrode formed over the substrate and formed of silicon doped with impurities, a gate wiring connected to the gate electrode, an active layer formed over the gate electrode, and source and drain electrodes connected to the active layer.

The gate wiring may include a silicon layer doped with the same impurities as the silicon forming the gate electrode and on the same layer as the gate electrode, and a metal layer formed on the silicon layer.

The active layer may be formed of amorphous silicon crystallized by heating. The impurities may be N-type impurities.

The flat panel display device may further include an etching stop layer on the active layer configured to protect the active layer from being etched. A gate insulating layer may be formed between the gate electrode and the active layer. A passivation layer may be formed on the source and drain electrodes.

The pixel unit may include a pixel electrode connected to the source or drain electrode, an opposite electrode facing the pixel electrode, and an emission operating layer interposed between the pixel electrode and the opposite electrode and configured to operate according to a voltage applied between the pixel electrode and the opposite electrode. The emission operating layer may include one of an organic emission layer and a liquid crystal layer.

According to the TFT and the flat panel display device disclosed herein, heat flow to the gate electrode during crystallization of the active layer may be prevented, and thus a stable crystallization may be ensured, thereby reducing a poor quality of a product.

BRIEF DESCRIPTION OF THE DRAWINGS

The above and other features and advantages will become more apparent by describing in detail exemplary embodiments thereof with reference to the attached drawings in which.

DETAILED DESCRIPTION OF CERTAIN INVENTIVE EMBODIMENTS

Figure 1:
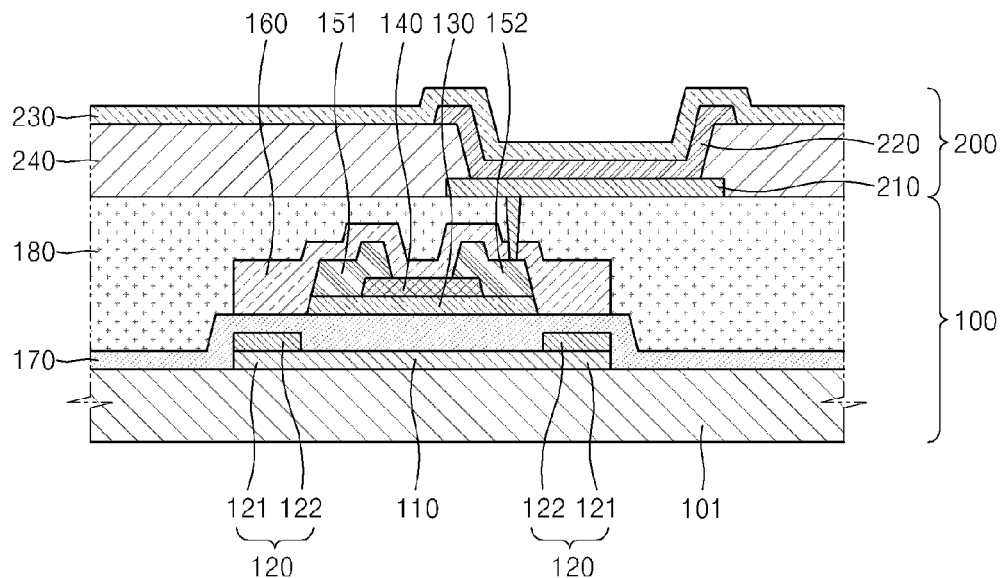
FIG. 1 is a cross-sectional view illustrating an embodiment of an organic light-emitting display device as an example of a flat panel display device.

Hereinafter, exemplary embodiments will be described in detail with reference to the attached drawings. Like reference numerals generally designate like elements throughout the specification. In the description, the detailed descriptions of well-known functions and structures may be omitted for ease of readability.

In the drawings, the thicknesses of layers and regions are exaggerated for clarity. It will also be understood that when a layer is referred to as being "on" another layer or substrate, it can be directly on the other layer or substrate, or intervening elements may also be present.

A method of crystallizing an active layer of the TFT through heating by using a laser has been widely used, wherein the active layer is formed of amorphous silicon. During the crystallization of the active layer, a problem may occur between the active layer and the gate electrode disposed under the active layer due to heat flow. The gate electrode formed of a metal, such as aluminum, and is disposed under the active layer. If heat is applied to the active layer, by using a laser in order to crystallize the active layer, heat is rapidly flowed to the gate electrode formed of a metal, and thus the active layer cannot be sufficiently crystallized.

Accordingly, in order to ensure stable crystallization of the active layer, there is a need to develop a method capable of solving such a problem due to heat flow.

FIG. 1 is a cross-sectional view illustrating an embodiment of an organic light-emitting display device as an example of a flat panel display device.

Referring to FIG. 1, the organic light-emitting display device includes a TFT 100 and a pixel unit 200.

The pixel unit 200 is driven by the TFT 100 and displays an image by emitting light. The pixel unit 200 includes a pixel electrode 210, an opposite electrode 230 facing the pixel electrode 210, and an organic emission layer 220, or an emission operating layer, interposed between the pixel electrode 210 and the opposite electrode 230. The pixel electrode 210 is connected to the TFT 100.

A predetermined voltage is applied to the opposite electrode 230 by the TFT 100. A voltage is also selectively applied to the pixel electrode 210 by the TFT 100. Accordingly, a predetermined voltage is formed between the pixel electrode 210 and the opposite electrode 230 according to the selective application of a voltage to the pixel electrode 210. When the predetermined voltage is applied, the organic emission layer 220 interposed between the pixel electrode 210 and the opposite electrode 230 displays an image by emitting light.

The TFT 100 has a structure in which a gate electrode 110, an active layer 130, and source and drain electrodes 151 and 152 are sequentially stacked on a substrate 101.

In some embodiments, the gate electrode 110 is electrically connected to a gate wiring 120 and receives current through the gate wiring 120. The gate electrode 110 may be formed of silicon doped with impurities. The gate wiring 120 may be configured as a double-layered structure in which a metal layer 122 formed of a metal, such as for example, aluminum, is formed on a silicon layer 121 doped with impurities. The gate electrode 110 may be formed of silicon doped with impurities. The silicon layer 121 and the gate electrode may be doped with the same impurities. The gate electrode 110 is not formed of a general metal, so that heat generated during crystallization of the active layer 130 formed of amorphous silicon does not flow through the gate electrode 110.

If the gate electrode 110 were formed of a general metal, heat applied to crystallize the active layer 130 would flow through the gate electrode 130, which is formed of a metal having excellent heat conductivity. With the gate electrode 110 being formed of silicon doped with impurities, since the silicon has relatively low heat conductivity, heat applied to the active layer 130 is sufficiently prevented from escaping to the gate electrode 110. Since the silicon is doped with impurities, the silicon has proper conductivity. The impurities may be N-type impurities such as, for example, phosphorus (P).

The gate wiring 120 should have high electron mobility in order to secure a control speed. In some embodiments, the gate wiring 120 is configured as a double-layered structure in which the metal layer 122 is formed on the silicon layer 121. The gate wiring 120 is not directly disposed under the active layer 130, like the gate electrode 110 is. Accordingly, even though the gate wiring 120 is formed of a metal, the gate wiring 120 does not obstruct the crystallization of the active layer 130. Thus, since electron mobility is of great importance, the metal layer 122 is formed to ensure high electron mobility.

The embodiment of an organic light emitting display device of FIG. 1 also includes a gate insulating layer 170, an etching stop layer 140 for protecting the active layer 130 from being etched, a passivation layer 160, a planarization layer 180, and a pixel-defining layer 240.

Figure 2:
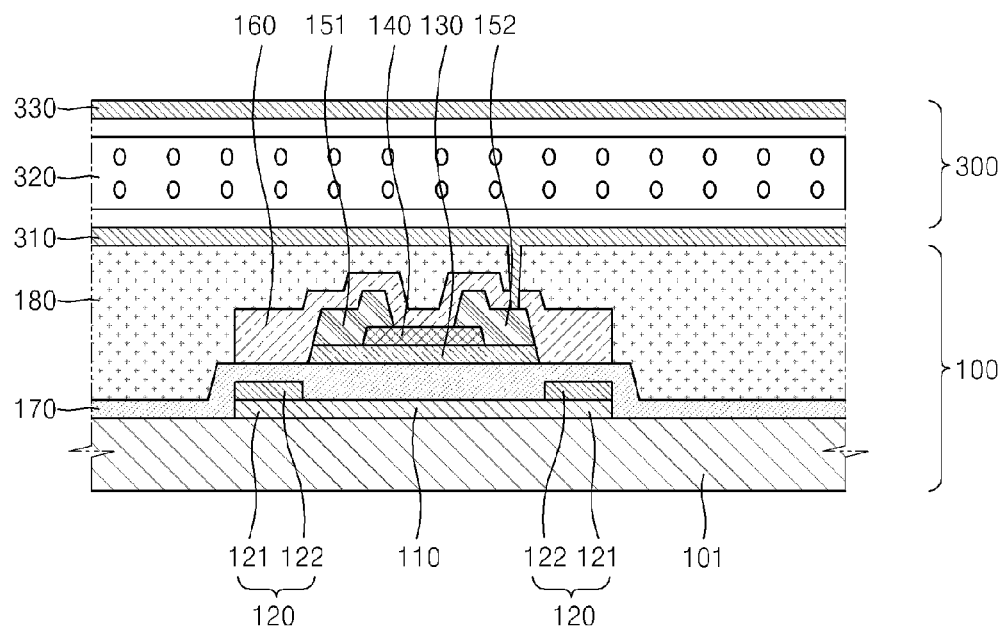
FIG. 2 is a cross-sectional view illustrating an embodiment of a liquid crystal display device as an example of a flat panel display device.

FIG. 2 illustrates an embodiment of a liquid crystal display device.

The liquid crystal display device includes a pixel unit 300 in which a liquid crystal layer 320 is formed between a pixel electrode 310 and an opposite electrode 330, and the TFT 100 illustrated in FIG. 1.

When a predetermined voltage is formed between the pixel electrode 310 and the opposite electrode 330 according to a selective application of a voltage by the TFT 100, an arrangement of liquid crystals of the liquid crystal layer 320 is changed to selectively allow backlight (not shown) to pass therethrough, thereby displaying an image.

The embodiment of a liquid crystal display device of FIG. 2 also includes a gate insulating layer 170, an etching stop layer 140 for protecting the active layer 130 from being etched, a passivation layer 160 and a planarization layer 180.

Hereinafter, a process for forming the TFT 100 that may be used in a flat panel display device such as the organic light-emitting display device of FIG. 1 or the liquid crystal display device of FIG. 2 will be described.

FIGS. 3A through 3E are schematic cross-sectional views for describing an embodiment of a process for manufacturing the TFT 100.

Figure 3A:
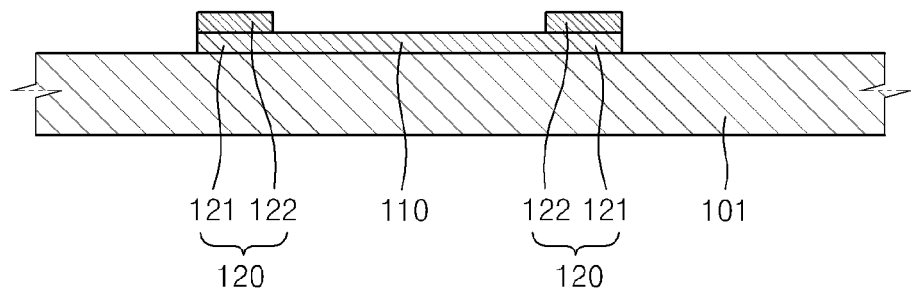
FIGS. 3A through 3E are cross-sectional views for describing an embodiment of a process of manufacturing a TFT of embodiments of the flat panel display devices illustrated in FIGS. 1 and 2.

Referring to FIG. 3A, the gate electrode 110 and the gate wiring 120 are formed on the substrate 101.

In some embodiments, the substrate 101 may be formed of glass or plastic. A buffer layer (not shown) may further be formed on the substrate 101 so as to maintain smoothness of the substrate 101 and to prevent impurities from entering the substrate 101.

The gate electrode 110 may be formed of silicon doped with impurities as described above. The gate wiring 120 may be configured as a double-layered structure in which the metal layer 122 is formed on the silicon layer 121. The gate electrode 110 and the silicon layer 121 may first be formed by depositing silicon on the substrate 101, N-type impurities doped thereon, and then the metal layer 122 may be formed on the silicon layer 121 of the gate wiring 120. The gate electrode 110 having relatively low heat conductivity compared to a metal, and the gate wiring 120 including the metal layer 122 and having high electron mobility may be formed.

Figure 3B:
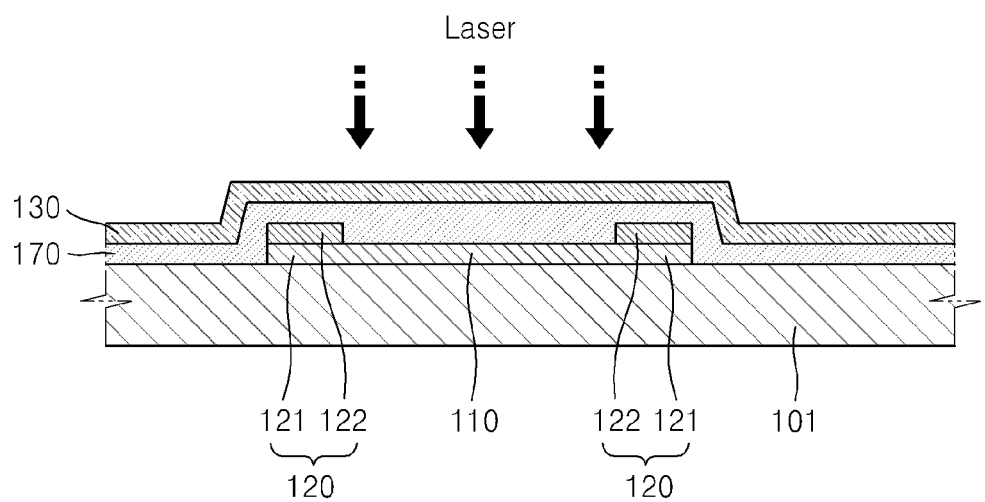

As illustrated in FIG. 3B, the gate insulating layer 170 and the active layer 130 are sequentially stacked over the previous structure.

The gate insulating layer 170 may be formed of an inorganic insulating layer material such as SiNx or SiOx, or of an organic layer material such as polyimide.

The active layer 130 may be formed of amorphous silicon. When a laser is irradiated onto the active layer 130 as illustrated in FIG. 3B, a corresponding portion is heated and is then crystallized. The gate electrode 110 formed of silicon doped with impurities is disposed below the active layer 130 on which the laser is irradiated. Therefore, the heat for crystallizing the active layer 130 may be sufficiently prevented from flowing to the gate electrode 110. Accordingly, the crystallization of the active layer 130 is stably performed, and poor quality of the active layer 130, such as for example, uncrystallization, may be prevented.

Figure 3C:
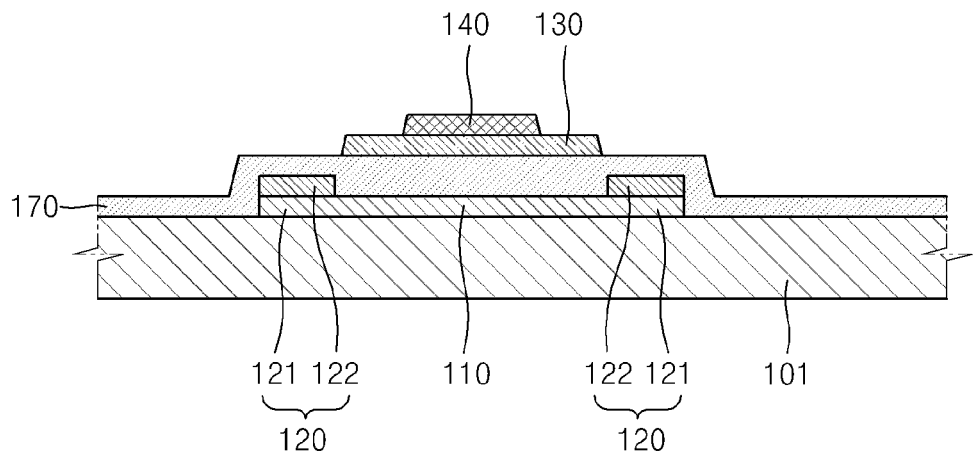

As illustrated in FIG. 3C, a pattern of the active layer 130 is formed by forming the etching stop layer 140 on the active layer 130 and etching the etching stop layer 140.

Figure 3D:
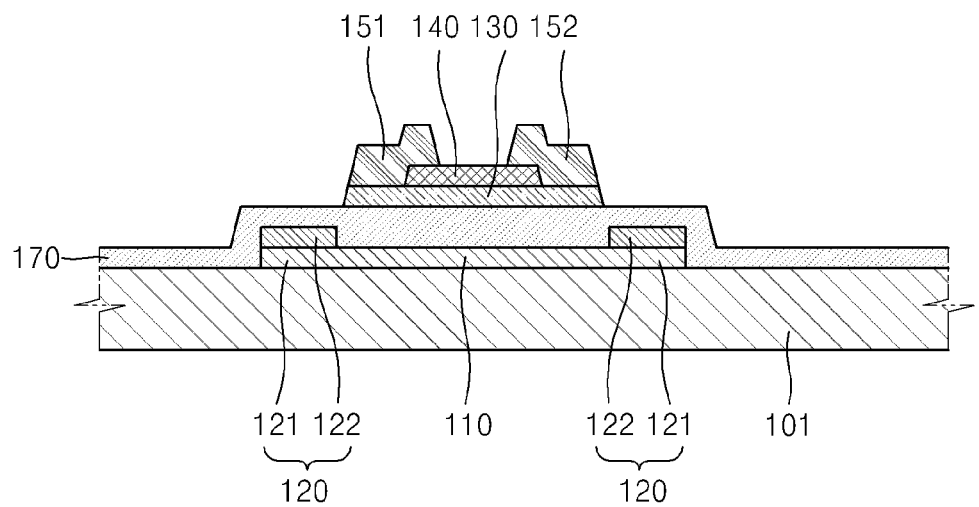
Figure 3E:
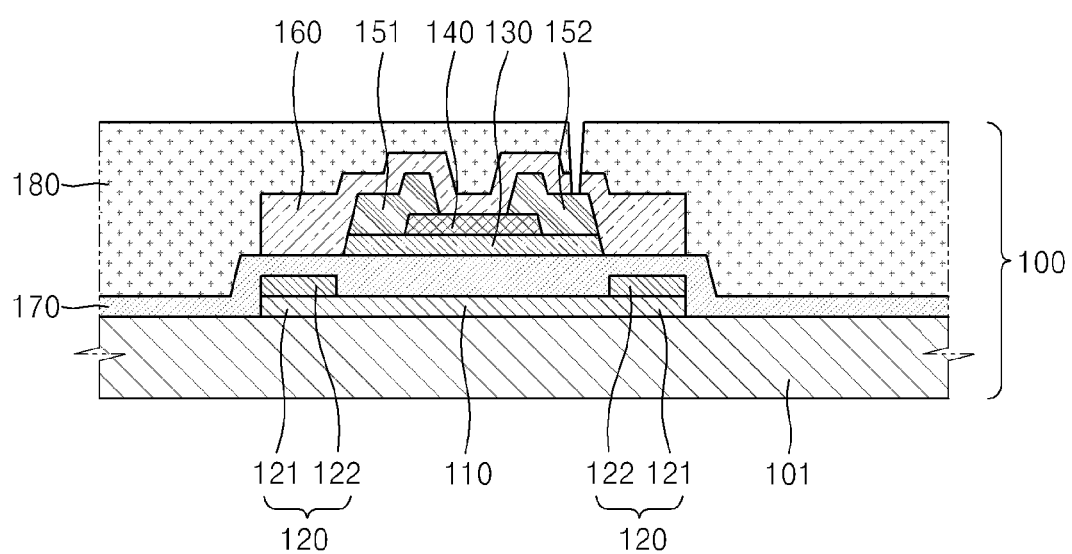

As illustrated in FIG. 3D, the source and drain electrodes 151 and 152 are formed, and as illustrated in FIG. 3E, the passivation layer 160 and the planarization layer 180 are formed.

The etching stop layer 140, the passivation layer 160, and the planarization layer 180 may each be formed of an organic insulating layer, or of an inorganic insulating layer.

The TFT 100 may be formed through the above processes. If a pixel unit 200 including a pixel electrode 210, an organic emission layer 220, and an opposite electrode 230 is formed on the TFT 100, an embodiment of the organic light-emitting display device of FIG. 1 may be formed. If a pixel unit 300 including a pixel electrode 310, a liquid crystal layer 320, and an opposite electrode 330 is formed on the TFT 100, an embodiment of the liquid crystal display device of FIG. 2 may be formed.

A TFT 100 capable of stably performing crystallization of the active layer 130 is realized, and the flat panel display device including the TFT 100 may secure a stable quality.

According to embodiments of a TFT and flat panel display devices including the TFT, since heat applied to crystallize an active layer is prevented from easily flowing to a gate electrode, stable crystallization of the active layer may be performed. Problems of poor quality of the active layer, such as for example, uncrystallization, may be solved. In addition, since a gate wiring does not include a metal layer, excellent electron mobility to the gate electrode may be secured.

In the embodiments described above, one TFT and one pixel unit are illustrated in the drawings, but this is just for convenience of description, and other embodiments may include a plurality of TFTs and a plurality of pixel.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A TFT comprising:
a substrate;
a gate electrode formed over the substrate, the gate electrode formed with silicon doped with impurities;
a gate wiring comprising a metal layer formed over at least portions of the gate electrode;
an active layer formed over the gate electrode; and
source and drain electrodes connected to the active layer,
wherein the gate wiring comprises:
a silicon layer doped with the same impurities as the silicon forming the gate electrode, and on the same layer as the gate electrode, and
a metal layer formed over the silicon layer.

2. The TFT of claim 1, wherein the active layer is formed of amorphous silicon crystallized by heating.

3. The TFT of claim 1, wherein the impurities are N-type impurities.

4. The TFT of claim 1, further comprising an etching stop layer on the active layer configured to protect the active layer from being etched.

5. The TFT of claim 1, wherein a gate insulating layer is formed between the gate electrode and the active layer.

6. The TFT of claim 1, wherein a passivation layer is formed over the source and drain electrodes.

7. A flat panel display device including a TFT and a pixel unit driven by the TFT, wherein the TFT comprises:
a substrate,
a gate electrode formed over the substrate and formed of silicon doped with impurities,
a gate wiring comprising a metal layer formed over at least portions of the gate electrode,
an active layer formed over the gate electrode, and
source and drain electrodes connected to the active layer,
wherein the gate wiring comprises:
a silicon layer doped with the same impurities as the silicon forming the gate electrode, and on the same layer as the gate electrode, and
a metal layer formed over the silicon layer.

8. The flat panel display device of claim 7, wherein the active layer is formed of amorphous silicon crystallized by heating.

9. The flat panel display device of claim 7, wherein the impurities are N-type impurities.

10. The flat panel display device of claim 7, further comprising an etching stop layer on the active layer configured to protect the active layer from being etched.

11. The flat panel display device of claim 7, wherein a gate insulating layer is formed between the gate electrode and the active layer.

12. The flat panel display device of claim 7, wherein a passivation layer is formed over the source and drain electrodes.

13. The flat panel display device of claim 7, wherein the pixel unit comprises a pixel electrode connected to the source or drain electrode, an opposite electrode facing the pixel electrode, and an emission operating layer interposed between the pixel electrode and the opposite electrode configured to operate according to a voltage applied between the pixel electrode and the opposite electrode.

14. The flat panel display device of claim 13, wherein the emission operating layer comprises at least one of an organic emission layer and a liquid crystal layer.

* * * * *